(12) United States Patent
Pidutti

(10) Patent No.: US 7,138,321 B2
(45) Date of Patent: Nov. 21, 2006

(54) BOOST CAPACITOR LAYOUT TECHNIQUE FOR AN H-BRIDGE INTEGRATED CIRCUIT MOTOR CONTROLLER TO ENSURE MATCHING CHARACTERISTICS WITH THAT OF THE LOW-SIDE SWITCHING DEVICES OF THE BRIDGE

(75) Inventor: Albino Pidutti, Urdine (IT)

(73) Assignee: STMicroelectronics, Inc., Carrollton, TX (US)

( * ) Notice: Subject to any disclaimer, the term of this patent is extended or adjusted under 35 U.S.C. 154(b) by 19 days.

(21) Appl. No.: 10/853,583

(22) Filed: May 25, 2004

(65) Prior Publication Data

US 2004/0213072 A1 Oct. 28, 2004

Related U.S. Application Data

(62) Division of application No. 09/594,831, filed on Jun. 14, 2000, now Pat. No. 6,759,728, which is a division of application No. 08/884,993, filed on Jun. 30, 1997, now Pat. No. 6,124,751.

(51) Int. Cl.
*H01L 21/22* (2006.01)

(52) U.S. Cl. ........................ 438/395; 438/210; 438/252; 257/299

(58) Field of Classification Search ............... 438/210, 438/252, 395; 257/299
See application file for complete search history.

(56) References Cited

U.S. PATENT DOCUMENTS

| | | | |
|---|---|---|---|
| 4,255,756 A * | 3/1981 | Shimotori et al. ......... 257/299 |
| 4,454,454 A | 6/1984 | Valentine ................... 318/293 |
| 4,491,746 A * | 1/1985 | Koike ........................ 327/534 |
| 4,535,203 A | 8/1985 | Jenkins et al. ............ 179/81 R |
| 4,720,467 A * | 1/1988 | Muggli et al. ............. 438/251 |
| 5,045,966 A * | 9/1991 | Alter ......................... 361/313 |
| 5,204,561 A | 4/1993 | Rischmüller ............... 307/571 |
| 5,221,881 A | 6/1993 | Cameron .................... 318/254 |
| 5,285,135 A | 2/1994 | Carobolante et al. ...... 318/254 |
| 5,286,991 A * | 2/1994 | Hui et al. .................... 257/306 |
| 5,297,024 A | 3/1994 | Carobolante ................ 360/67 |
| 5,302,534 A | 4/1994 | Monl et al. .................. 437/31 |
| 5,332,954 A | 7/1994 | Lankin ....................... 318/139 |
| 5,364,801 A * | 11/1994 | Smayling et al. ........... 438/571 |
| 5,489,870 A | 2/1996 | Arakawa .................... 327/536 |
| 5,566,369 A | 10/1996 | Carobolante ................ 360/75 |
| 5,608,258 A * | 3/1997 | Rajkanan et al. .......... 257/532 |
| 5,642,065 A | 6/1997 | Choi et al. .................. 327/110 |
| 5,712,536 A | 1/1998 | Haas et al. ................. 315/247 |
| 5,737,144 A | 4/1998 | Ataee et al. ................ 360/75 |

(Continued)

OTHER PUBLICATIONS

Irwin, Chap. 11, Maximum Average Power Transfer, Basic Engineering Circuit Analysis, 3$^{rd}$ Edition, p. 453-454, 1990.

(Continued)

*Primary Examiner*—Bradley K. Smith
*Assistant Examiner*—Steven J. Fulk
(74) *Attorney, Agent, or Firm*—David V. Carlson; Lisa K. Jorgenson

(57) ABSTRACT

An H-bridge circuit having a boost capacitor coupled to the gate of the low-side driver. A driver, in the form of a switching transistor is connected between the load and ground, thus providing a low-side driver. A capacitor is coupled to the gate of the low-side driver to provide a boosted voltage for rapid turn on of the gate. The size of the capacitor selected to be similar to the size of the capacitance associated with the low-side driver transistor.

28 Claims, 2 Drawing Sheets

U.S. PATENT DOCUMENTS

| | | | |
|---|---|---|---|
| 5,757,215 A | 5/1998 | Schuelke et al. | 327/110 |
| 5,841,603 A | 11/1998 | Ramalho et al. | 360/68 |
| 5,867,334 A | 2/1999 | Soichi et al. | 360/68 |
| 5,869,988 A | 2/1999 | Jusuf et al. | 327/110 |
| 5,903,034 A * | 5/1999 | Sakamoto et al. | 257/379 |
| 5,973,366 A | 10/1999 | Tada | 257/354 |
| 6,052,017 A | 4/2000 | Pidutti et al. | 327/424 |
| 6,124,751 A | 9/2000 | Pidutti | 327/424 |
| 6,166,869 A | 12/2000 | Pidutti et al. | 360/46 |
| 6,218,895 B1 | 4/2001 | De et al. | 327/566 |
| 6,759,728 B1 | 7/2004 | Pidutti | 257/532 |

OTHER PUBLICATIONS

Pedrazzini, "IBM's Hard Disk Drive Load/Unload Technology," *Computer Data Storage Newsletter*, Jul. 1997, vol. 10(7), Issue No. 114, p. 12.

* cited by examiner

BOOST CAPACITOR LAYOUT TECHNIQUE FOR AN H-BRIDGE INTEGRATED CIRCUIT MOTOR CONTROLLER TO ENSURE MATCHING CHARACTERISTICS WITH THAT OF THE LOW-SIDE SWITCHING DEVICES OF THE BRIDGE

CROSS REFERENCE TO RELATED APPLICATIONS

The present application is a divisional of U.S. patent application Ser. No. 09/594,831 filed Jun. 14, 2000 (now U.S. Pat. No. 6,759,728), which is a divisional of U.S. patent application Ser. No. 08/884,993 filed Jun. 30, 1997 (now U.S. Pat. No. 6,124,751).

BACKGROUND OF THE INVENTION

1. Field of the Invention

The present invention relates, in general, to the field of direct current ("DC") motor control circuits. More particularly, the present invention relates to an integrated circuit ("IC") "H" switch, or H-bridge, motor control circuit incorporating a boost capacitor for the low-side metal oxide semiconductor ("MOS") transistor switching devices in the H-bridge in which the characteristics of the respective capacitors are closely matched to that of the associated switching device.

2. Description of the Related Art

The DC low voltage fractional horsepower motor is a standard for applications that require bi-directional shaft control such as cassette tape drives, automobile power windows, seats, door locks or windshield wipers, robotic mechanical controls, small industrial machines etc. As such, H-bridge circuits have been developed in lieu of mechanical reversing gears and linkages for reversing the motor supply voltage. In an H-bridge, opposing top and bottom switching devices (bipolar, Darlington or MOS transistors for example) couple the DC motor input leads to a voltage source and circuit ground to control the motor direction by switching the voltage polarity, which, in turn, switches the motor's shaft rotation either clockwise or counter-clockwise.

Bipolar transistors are generally not satisfactory in these applications due to their relatively large base drive requirement and Darlington transistors exhibit a large forward voltage drop across the devices which reduce voltage to the motor. For these reasons, MOS transistors are often utilized in H-bridge applications as disclosed in U.S. Pat. No. 4,454,454 issued Jun. 12, 1984 for "'MOSFET 'H' Switch for a DC Motor".

Still other H-bridge circuits have utilized MOS transistors in order to control the current through the load in addition to switching voltage polarity. In this regard, the low-side switching devices function as current generators to force a defined current through the load. However, after each transition, the current generators take a finite time to reach a steady-state condition. In order to reduce this time and speed the overall system operation, an additional charge, through the use of an inverter and associated boost capacitor, may be added to the gate of the low-side switching devices. However, for optimal performance, there must be a good match between the boost capacitors and the input capacitance of the switching transistors. This is especially difficult to achieve in integrated circuit H-bridges due to the inherent variations in processing technology.

BRIEF SUMMARY OF THE INVENTION

As mentioned previously, in order to provide effective boost, the boost capacitors must be closely matched with the respective input capacitance of the associated switching transistors. In order to effectuate this effective matching despite manufacturing process variations, the present invention may utilize the source structure of the transistors for the formation of the respective boost capacitors. Since the capacitors are basically MOS devices themselves, the gate of the associated transistor forms one terminal of the capacitors while the P-well forms the other terminal. The gate of these capacitors may consist of more poly fingers extending from the respective transistors in order to reproduce the same border effect of these devices.

Particularly disclosed herein is an integrated H-bridge circuit including first and second pairs of high-side and low-side switching devices for selectively coupling an electrical load between first and second voltage supply lines. The circuit comprises a boost capacitor coupled to a switching terminal of each of the low-side switching devices, with the boost capacitor having a capacitance substantially equivalent to an input capacitance of an associated one of the low-side switching devices.

In a particular embodiment, disclosed herein is a boost capacitor for supplying a voltage potential to an associated MOS transistor. The boost capacitor comprises a capacitor body formed in a portion of a semiconductor substrate with the capacitor body being formed of a first impurity type. A plurality of regions are formed in the capacitor body, with the regions being formed of a second, opposite impurity type. An insulating layer overlies the capacitor body between the plurality of regions and a conductive layer overlies the insulating layer. The effective capacitance of the boost capacitor is substantially equal to the conductive layer-to-capacitor body and the conductive layer-to-plurality of regions capacitance and is substantially equal to an input capacitance of the associated MOS transistor.

Further disclosed herein is a method for forming an integrated H-bridge circuit including a boost capacitor and an associated MOS transistor. The method comprises the steps of: providing a semiconductor substrate and forming first and second wells in the substrate overlying first and second buried layers. A plurality of regions are diffused in the first and second wells of an impurity type opposite to that of the first and second wells and an insulating layer is formed overlying the first and second wells between the diffused regions. A conductive layer is also formed overlying the insulating layer. The various structures are formed concurrently of the same materials and are laid out such that the corresponding dimensions of each are substantially identical where possible.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION OF THE INVENTION

Figure 1:
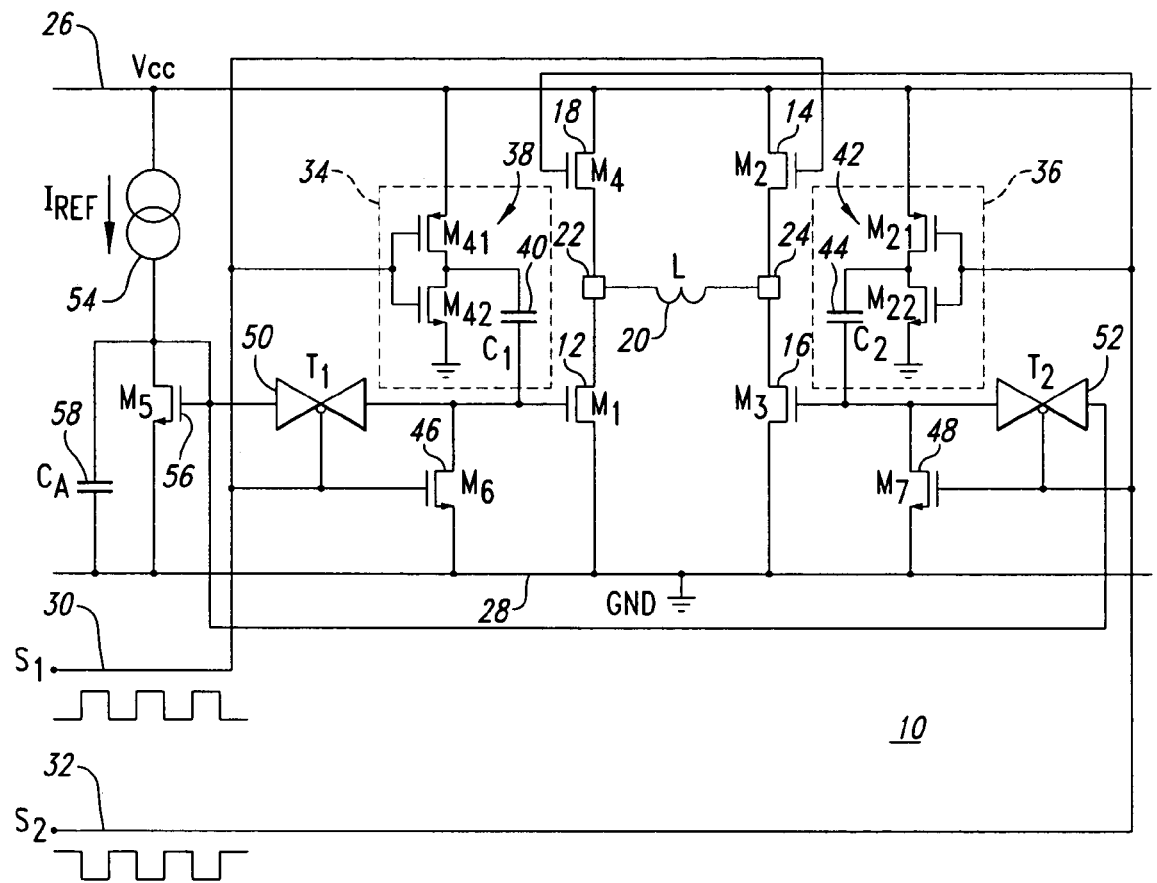
FIG. 1 is a schematic illustration of an H-bridge integrated circuit in accordance with the present invention illustrating the coupling of a DC load, for example a motor ("L") to the pair of high-side and low-side switching transistors in a full bridge configuration and illustrating the boost capacitors ("C₁") and ("C₂") associated respectively with the low-side switching transistors ("M₁") and ("M₃")

With reference now to FIG. 1, an H-bridge circuit 10 in accordance with the present invention is shown. The H-bridge circuit 10 comprises, in pertinent part, four MOS transistors, coupled in series connected pairs between a supply voltage rail and circuit ground. A load is coupled between the two series connected pairs resulting in an "H" configuration.

In this regard, the H-bridge circuit 10 comprises four MOS transistors 12 (M₁), 14 (M₂), 16 (M₃) and 18 (M₄) which are selectively activated to couple a DC load 20 (L), such as a DC motor for example, between a first supply voltage line 26 ("$V_{cc}$") and a second supply voltage line 28 ("Gnd"). For example, and ignoring any voltage drop across the source-to-drain of the transistors, when transistors 12 and 14 are activated, $V_{cc}$ appears on terminal 24 while terminal 22 is effectively at Gnd. Alternatively, when transistors 16 and 18 are activated, $V_{cc}$ is applied to terminal 22 while terminal 24 is essentially at Gnd. In the exemplary illustration shown, transistors 12 and 16 may be referred to as "low-side" transistors while transistors 14 and 18 may be referred to as "high-side" transistors. The transistors 12–18 function as switching devices and transistors 12 and 16 may be conveniently furnished as power N channel MOS devices while the transistors 14 and 18 are preferably P-channel devices as N-channel devices would require a voltage source higher than Vcc resulting in a more complex circuit design.

The H-bridge circuit 10 is activated by pulse width modulated ("PWM") signals appearing on signal lines 30 ("S₁") and 32 ("S₂"). As shown, the signals on lines 30 and 32 are 180 degrees out of phase with each other. Signal line 30 is coupled to the common connected gate terminals of two transistors ("M₄₁," and "M₄₂") coupled to form an inverter 38 and which, in combination with an associated boost capacitor 40, comprises a boosted inverter circuit 34. Signal line 30 is also coupled to the gate of high side transistor 14 (M₂). In like manner, signal line 32 is coupled to the common connected gate terminals of two transistors ("M₂₁," and "M₂₂") coupled to form an inverter 42 and which, in combination with an associated boost capacitor 44 comprise a boosted inverter circuit 36. Signal line 32 is also coupled to the gate of high-side transistor 18 (M₄).

As shown, signal line 30 is also coupled to the gate of an additional transistor 46 ("M₆") which couples the gate of low-side transistor 12 (M₁) to Gnd. In like manner, signal line 32 is coupled to the gate of transistor 48 ("M₇") which couples the gate of low-side transistor 16 (M₃) to Gnd. Signal lines 30 and 32 are further coupled to the control terminal of devices T₁ and T₂ respectively which serve to selectively couple the signal appearing on either the gate of low-side transistor 12 (M₁) or the gate of low-side transistor 16 (M₃) to the gate of transistor 56 ("M₅") which is coupled in series with a reference current source 54 ("$I_{REF}$") between the first supply voltage line 26 ($V_{cc}$) and the second supply voltage line 28. A capacitor 58 ("$C_A$") is coupled in parallel with the transistor 56 (M₅) as shown.

In order to provide effective boost, the boost capacitors 40 (C₁) and 44 (C₂) must be closely matched with the respective input capacitance of the associated transistors 12 (M₁) and 16 (M₃). In order to effectuate this effective matching despite manufacturing process variations, the present invention utilizes the source structure of transistors 12 (M₁) and 16 (M₃) for the formation of capacitors 40 and 44 respectively. Since the capacitors 40 and 44 are basically MOS devices themselves, the gate of transistors 12 and 16 form one terminal of the capacitors while the P-well forms the other terminal. The gate of these capacitors 40, 44 consists of more poly fingers extending from the respective transistors 12, 16 in order to reproduce the same border effect of these devices. This is shown more fully in the following figure as described hereinafter.

As further shown in FIG. 1, capacitor 58 ($C_A$) is placed in parallel with transistor 56 (M₅) to reduce the $\Delta V_{GS}$ of the device. As a consequence, the change in the gate-to-source voltage of transistor 56 may be given to a first approximation as:

$$\Delta V_{GS} = [V_{CC}*C_1 - V_{GS}M_5(C_gM_1+C_1)]/[CgM_1+C_1+C_gM_5+C_A]$$

Figure 2A:
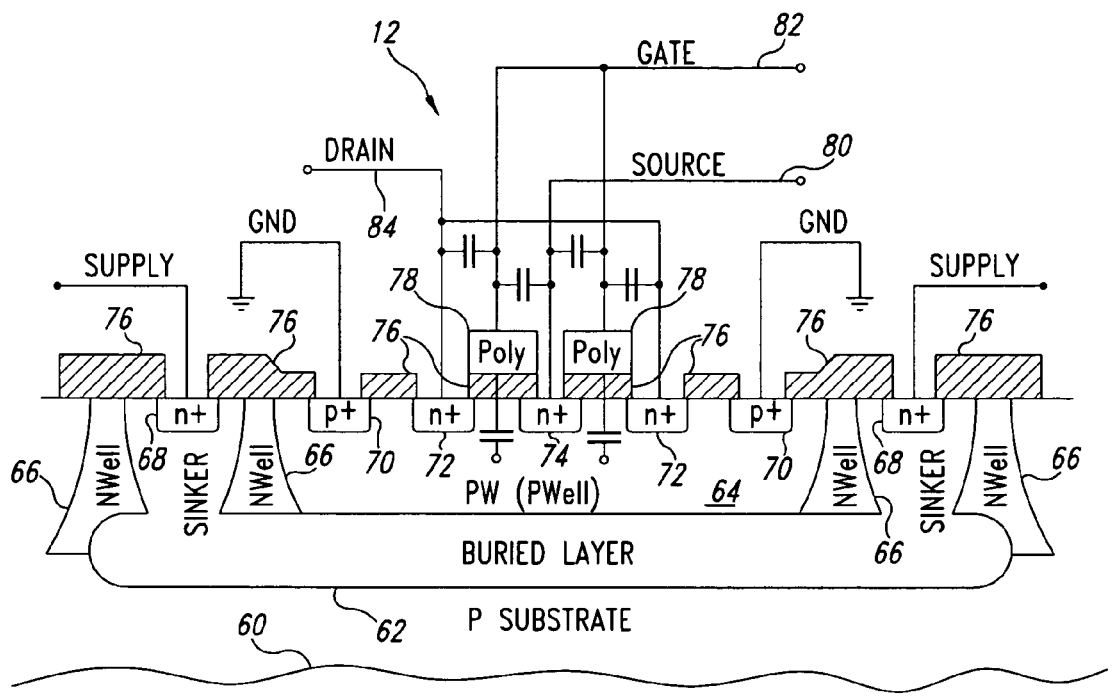
FIG. 2A is a partial cross-sectional drawing of one of the two low-side switching transistors (for example, M₁) illustrating the construction thereof.
Figure 2B:
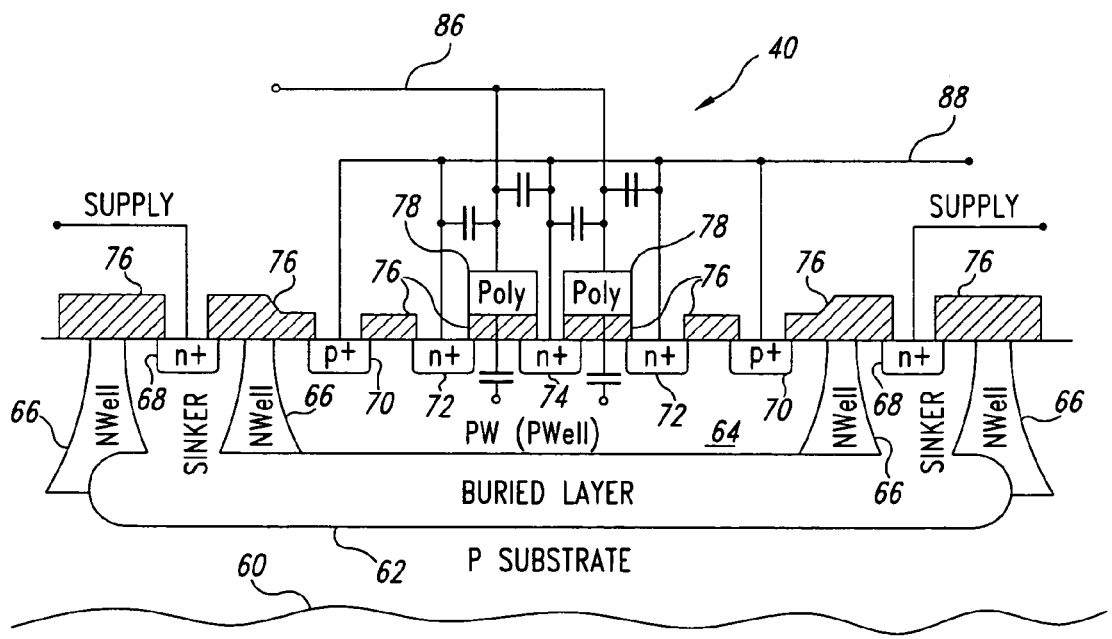
FIG. 2B is a corresponding, partial cross-sectional drawing of a corresponding one of the boost capacitors (C₁) illustrating the use of equivalent structure to that of the low-side switching transistor (M₁) to ensure matching characteristics.

With reference now to FIGS. 2A and 2B, partial cross-sectional views of transistor 12 (M₁) and boost capacitor 40 (C₁) are shown to illustrate corresponding structure and inherent capacitances of each circuit element. In the exemplary embodiment of the H-bridge 10 shown, both devices are formed on a P-type substrate 60 in which a buried layer 62 and associated sinkers are formed. A P-well 64 ("PW") is formed overlying the buried layer 62 and is isolated from the sinkers by N-wells 66, others of which serve to isolate the sinkers from the P-type substrate 60 as shown. A pair of N+ wells 68 are formed within the sinkers and a pair of P+ wells 70 are formed within the P-well 64. Drain regions for the transistor 12 are formed of N+ diffusions 72 in the P-well 64 along with an additional source region defined by an additional N+ diffusion 74. Oxide regions 76 (formed, for example, of silicon dioxide) are selectively patterned and etched overlying portions of the transistor 12 structure and also forming gate oxide underlying doped polysilicon gates 78.

As shown, the transistor is defined by electrical connections to the various N+ diffused regions 72, 74 with the drain 84 being coupled to N+ diffusions 72, the source 80 being coupled to N+ diffusion 74 and the gate 82 being coupled to the polysilicon gates 78. The polysilicon gates 78 exhibit an inherent capacitance to the P-well 64 through the underlying gate oxide 76 while there is also inherent capacitance between the gate 82 to source 80 and gate 82 to drain 84 portions of the transistor 12.

Correspondingly, and with particular reference to FIG. 2B, the boost capacitor 40 is laid out to have a structure and dimensions as similar to that of transistor 12 as is possible, with all of the inherent capacitance values therefore being as equivalent as that entails. Preferably, the boost capacitor 40 and transistor 12 are formed concurrently during the manufacture of an integrated circuit version of the H-bridge 10. In this figure, the gate 86 (or one terminal) of the capacitor 40 is coupled to the two polysilicon gates 78 while the other terminal 88 of the capacitor 40 is coupled to the P+ diffusions 70 and N+ diffusions 72, 74 as shown.

Due to the fact that in the H-bridge 10 of FIG. 1 the sources of the transistors 12, 14 (M₁ and M₂) are coupled to Gnd, the capacitance between the polysilicon gates 78 and the P-well 64 and the capacitance between the gates 78 and source 80 (coupled to N+ diffused region 74) are in parallel, they comprise the largest portion of the transistor 12, 14 input capacitance. It should be noted that the gate 78 to drain 84 (coupled to the N+ diffused regions 72) is not relatively large but it can be amplified due to the "early" effect. In any event, if the voltage drain does not change, there is effectively no "early" effect and it is possible to consider the gate-to-drain capacitance as in parallel with the gate-to-P-well and gate-to-source capacitances. The FIGS. 2A and 2B illustrate the comparable structures and inherent capacitances of the transistor 12 ($M_1$) and boost capacitor 40 ($C_1$) as an example and the same analysis would also pertain to transistor 16 ($M_3$) and associated boost capacitor 44 ($C_2$).

With particular reference to FIG. 2B, the boost capacitor 40 is shown wherein the total capacitance is the sum of the polysilicon gate 78 to P-well 64 capacitance and the gate 78 to N+ diffused regions 72 and 74 capacitance. Since the boost capacitor 40 has the same structure to that of the corresponding transistor 12, a good match is provided with its input capacitance. In practice, the best match is provided when the layout of the two devices is exactly the same. This implies that the same gate length, the same distance between the two gate fingers and other dimensions are the same. However, in certain design layouts, an exact match might be difficult due to die size concerns. For this reason, it is also contemplated by the present invention that the polysilicon fingers of the boost capacitor 40 may be made larger than the gate fingers of the transistor 12. Moreover, the distance between the respective fingers may be somewhat different and still provide an effective capacitance match.

The boost capacitor 40, 44 values are ultimately dependent upon the input capacitance of the associated transistor 12, 16, its gate-to-source voltage and on the supply voltage $V_{cc}$. While these factors define the value of the boost capacitor 40, it is usually different from the input capacitance of the associated transistor 12. On the other hand, the layout structure of the boost capacitors 40, 44 and the associated transistors 12, 16 is the same. This means that both structures are formed by more polysilicon fingers. While the dimensions of these polysilicon finders are preferably the same, the number of the fingers may be different.

All of the above U.S. patents, U.S. patent application publications, U.S. patent applications, foreign patents, foreign patent applications and non-patent publications referred to in this specification and/or listed in the Application Data Sheet, including but not limited to U.S. patent application Ser. No. 09/594,831, filed Jun. 14, 2000, and entitled "BOOST CAPACITOR LAYOUT" and U.S. Pat. No. 6,124,751, issued Sep. 26, 2000, and entitled "BOOST CAPACITOR FOR AN H-BRIDGE INTEGRATED CIRCUIT MOTOR CONTROLLER HAVING MATCHING CHARACTERISTICS WITH THAT OF THE LOW-SIDE SWITCHING DEVICES OF THE BRIDGE" are incorporated herein by reference, in their entirety.

While there have been described above the principles of the present invention in conjunction with specific device structure and processing steps, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method of forming a capacitor, the method comprising:

forming a capacitor body in a portion of a semiconductor substrate, the capacitor body being of a first conductivity type and being a first plate of the capacitor;

forming a plurality of regions at locations in the semiconductor substrate, the regions including regions of a second, opposite conductivity type than the capacitor body and the plurality of regions being a second plate of the capacitor;

forming an electrical conductor coupled to the plurality of regions to couple the plurality of regions to each other;

forming an insulating layer overlying portions of the capacitor body and the plurality of regions at selected locations; and forming a conductive layer overlying the insulating layer, the conductive layer being an additional plate of the capacitor such that an effective capacitance of the capacitor is determined by a capacitance of the conductive layer to the capacitor body and a capacitance of the conductive layer to the plurality of regions, wherein forming the electrical conductor coupled to the plurality of regions to couple the plurality of regions to each other includes:

coupling regions of said plurality that have opposite conductivity types to each other.

2. The method of claim 1 wherein forming the plurality of regions includes employing an impurity type and a concentration of impurities that are a same conductivity type and concentration as source and drain regions of the transistor in an adjacent location within same said semiconductor substrate.

3. The method of claim 2 wherein the transistor in the adjacent location includes a MOS transistor.

4. A method of forming a boost capacitor for supplying a voltage potential to an associated transistor, the method comprising:

forming a capacitor body of a first impurity type in a first portion of a semiconductor substrate;

forming a plurality of regions in the capacitor body, the regions being of a second, opposite impurity type relative to the first impurity type;

forming first additional regions in the capacitor body, the first additional regions being of the first impurity type;

overlying the capacitor body between the plurality of regions with an insulating layer;

overlying the insulating layer with a conductive layer, an effective capacitance of the boost capacitor being substantially equal to a capacitance of the conductive layer-to-the capacitor body plus a capacitance of the conductive layer-to-the plurality of regions; and forming an electrical conductor to couple the regions of the second impurity type to the first additional regions of the first impurity type to each other.

5. The method of claim 4, further comprising forming the associated transistor by:
forming a transistor body in another portion of the semiconductor substrate, the transistor body being of the first impurity type;
forming a plurality of second additional regions in the transistor body, the second additional regions being of the second impurity type;
overlying the transistor body with an additional insulating layer between the plurality of second additional regions; and
overlying the additional insulating layer with an additional conductive layer, the transistor having an effective capacitance that is substantially equal to a capacitance of the additional conductive layer-to-the transistor body plus a capacitance of the additional conductive layer-to-the plurality of second additional regions.

6. The method of claim 5 wherein forming the capacitor body includes:
forming a first buried layer in the semiconductor substrate; and
forming a first P-well overlying the first buried layer, wherein forming the transistor body includes:
forming a second buried layer in the semiconductor substrate; and
forming a second P-well overlying the second buried layer.

7. The method of claim 6 wherein the plurality of regions and the first additional regions are formed by diffusing N+ dopants into the first and second P-wells, respectively.

8. The method of claim 5 wherein the capacitor body and the transistor body have substantially identical dimensions.

9. The method of claim 5 wherein forming the associated transistor includes forming a MOS transistor.

10. The method of claim 4 wherein the effective capacitance is substantially equal to an input capacitance of the associated transistor.

11. The method of claim 4, further comprising wherein:
forming the electrical conductor to couple the plurality of regions in the capacitor body to each other is performed so that the regions are electrically coupled in parallel.

12. The method of claim 4, further comprising forming the associated transistor by:
forming a transistor body in another portion of the semiconductor substrate, the transistor body being of the first impurity type;
forming a plurality of second additional regions in the transistor body, the second additional regions being of the second impurity type;
overlying the transistor body with an additional insulating layer between the plurality of second additional regions; and
wherein the conductive layer overlying the insulating layer is a single contiguous layer that also overlies the additional insulating layer and forms a gate electrode of the transistor.

13. The method of claim 12 wherein forming the associated transistor includes forming a MOS transistor.

14. A method for forming an integrated H-bridge circuit including a boost capacitor and an associated transistor, the method comprising:

providing a semiconductor substrate;
forming in said substrate first and second wells overlying at least a first buried layer;
diffusing a plurality of regions in said first and second wells;
overlying said first and second wells with an insulating layer between said diffused regions; and
overlying said insulating layer with a conductive layer; and
coupling regions of said plurality in said first well, said coupled regions including some regions of opposite impurity types, to each other so that said regions in said first well are electrically coupled in parallel and form a plate of said boost capacitor.

15. The method of claim 14 wherein said providing the semiconductor substrate includes providing a P type semiconductor substrate.

16. The method of claim 14 wherein said forming is carried out such that said first and second wells have substantially identical dimensions.

17. The method of claim 14 wherein said diffusing is carried out such that said plurality of regions have substantially identical dimensions in corresponding positions in said first and second wells.

18. The method of claim 14 wherein said diffusing includes diffusing with N+ material.

19. The method of claim 14 wherein said overlying with the insulating layer is carried out such that said insulating layer has substantially uniform thickness.

20. The method of claim 14 wherein said overlying with the insulating layer includes overlying with silicon dioxide.

21. The method of claim 14 wherein said overlying with the conductive layer is carried out such that said conductive layer has substantially uniform thickness.

22. The method of claim 14 wherein said overlying with the conductive layer includes overlying with doped polysilicon.

23. The method of claim 14 wherein the associated transistor includes a MOS transistor.

24. A method to form a capacitor, the method comprising:
forming a capacitor body in a portion of a semiconductor substrate, said capacitor body being of a first conductivity type and forming a first plate of the capacitor;
forming a plurality of regions at locations in said semiconductor substrate, said regions forming a second plate of the capacitor, said regions including first regions of the first conductivity type and second regions of a second, opposite conductivity type relative to the first conductivity type;
coupling an electrical conductor to the plurality of regions to couple them in parallel with each other, including coupling the first and second regions of opposite conductivity types to a common terminal of the capacitor;
forming an insulating layer overlying portions of said capacitor body and said plurality of regions at selected locations; and
forming a conductive layer overlying said insulating layer and forming an additional plate of the capacitor such that an effective capacitance of said capacitor is determined by a capacitance of said conductive layer-to-said capacitor body and a capacitance of said conductive layer-to-said plurality of regions.

25. The method of claim 24 wherein forming the conductive layer includes forming portions of the conductive layer that are to have a same potential.

26. The method of claim 24, further comprising simultaneously forming, with the capacitor, parts a transistor.

27. The method of claim 26 wherein forming parts of the transistor includes forming parts of a MOS transistor.

28. The method of claim 24 wherein the conductive layer forming the additional plate of the capacitor forms a control terminal of the transistor, and wherein at least some of said regions forming the second plate of the capacitor form additional terminals of the transistor.

* * * * *